(12) United States Patent  
Marzetta et al.

(10) Patent No.: US 8,810,253 B2
(45) Date of Patent: *Aug. 19, 2014

(54) CHARACTERIZATION OF ELECTRICAL POWER DISTRIBUTION SYSTEMS USING CHARACTERIZATION MATRICES

(76) Inventors: Thomas L. Marzetta, Summit, NJ (US); Bertrand M. Hochwald, South Bend, IN (US)

( * ) Notice: Subject to any disclaimer, the term of this patent is extended or adjusted under 35 U.S.C. 154(b) by 299 days.

This patent is subject to a terminal disclaimer.

(21) Appl. No.: 13/423,227

(22) Filed: Mar. 18, 2012

(65) Prior Publication Data

US 2012/0182038 A1 Jul. 19, 2012

Related U.S. Application Data

(63) Continuation-in-part of application No. 12/885,883, filed on Sep. 20, 2010, now Pat. No. 8,427,169.

(51) Int. Cl.
*G01R 31/08* (2006.01)
*G01R 31/02* (2006.01)

(52) U.S. Cl.
CPC ............ *G01R 31/086* (2013.01); *Y04S 10/522* (2013.01); *G01R 31/026* (2013.01)
USPC ........................... 324/532; 324/522; 324/523

(58) Field of Classification Search
USPC .................................. 324/522, 523, 527, 532
See application file for complete search history.

(56) References Cited

U.S. PATENT DOCUMENTS

| | | | |
|---|---|---|---|
| 3,810,003 A | 5/1974 | Portoulas | |
| 3,952,244 A | 4/1976 | Spear | |
| 5,278,512 A | 1/1994 | Goldstein | |
| 5,525,908 A | 6/1996 | Brownell | |
| 5,914,666 A * | 6/1999 | Zingsheim et al. | 340/3.5 |
| 6,064,313 A | 5/2000 | Anderson | |
| 2006/0132143 A1 | 6/2006 | Sears et al. | |

* cited by examiner

*Primary Examiner* — Vincent Q Nguyen
(74) *Attorney, Agent, or Firm* — Brian R. Short

(57) ABSTRACT

Embodiments of methods and apparatuses for characterizing an electrical power distribution system are disclosed. One method includes applying a plurality of test signals to a first plurality of test points of the electrical power distribution system, measuring a plurality of response signals at a second plurality of test points of the electrical distribution system, deriving a characterization matrix for the electrical power distribution system from the plurality of test signals and response signals, and characterizing the electrical power distribution system based on the derived characterization matrix.

23 Claims, 5 Drawing Sheets

CHARACTERIZATION OF ELECTRICAL POWER DISTRIBUTION SYSTEMS USING CHARACTERIZATION MATRICES

RELATED APPLICATIONS

This patent application is a continuation-in-part of pending U.S. patent application Ser. No. 12/885,883, filed Sep. 20, 2010.

FIELD OF THE DESCRIBED EMBODIMENTS

The described embodiments relate generally to testing an electrical power distribution system. More specifically, the described embodiments relate to methods and apparatuses for characterizing distribution systems using characterization matrices.

BACKGROUND

An electrical power distribution system or premises wiring of a building or structure whose wiring is generally inaccessible for visual inspection and for which only limited blueprint information may be available can be very difficult to characterize. The system is normally used to distribute power from a centralized feed through a distribution panel and branch circuits to various locations within the structure that require a source of electricity. Such locations might include dedicated circuits for motors, ventilation, heating, cooling, lighting, safety-systems, alarms, or general purpose outlets. Electrical systems usually comprise voltage sources, often connected through a service panel, and protected against overload by circuit breakers and fuses, distributed along branch circuits by a variety of wiring and junction boxes, conduits, and raceways. Such wiring and boxes are often contained within the structure within walls, floors, or ceilings of buildings, hidden from view and difficult to access without intrusive and potentially destructive methods.

There are a variety of voltages, currents, and multi-phase circuits possible for common industrial, commercial, and residential power distribution systems. Each such circuit may be divided and further subdivided in the form of branch circuits that travel throughout a commercial building or dwelling. Characterizing these branch circuits is key for determining whether the electrical system is functional and safe.

As buildings age, the condition of the wiring deteriorates because of normal aging, infiltration of elements, action by vermin, sub-standard modifications that do not meet current electrical codes, or abuse or overloading, or incorrect installation. It would be desirable to characterize the electrical system condition without invasive or destructive tests, and without endangering the personnel making such tests. Furthermore, such characterization should not contribute to any deterioration of the condition of the system.

There is a need to be able to easily characterize an electrical power distribution system or premises wiring of a building or structure whose wiring is generally inaccessible for visual inspection and for which only limited blueprint information may be available.

SUMMARY OF THE DESCRIBED EMBODIMENTS

An embodiment includes a method of characterizing an electrical power distribution system. The method includes applying a plurality of test signals to a first plurality of test points of the electrical power distribution system, measuring a plurality of response signals at a second plurality of test points of the electrical distribution system, deriving a characterization matrix for the electrical power distribution system from the plurality of test signals and response signals, and characterizing the electrical power distribution system based on the derived characterization matrix. In an embodiment, the first plurality and second plurality of test points may be the same. In other embodiments, the first plurality and second plurality of test points may differ or be subsets of one another.

Another embodiment includes a system for characterizing an electrical power distribution system. The system includes a plurality of characterization matrix test/response units attached to a first plurality of test points and second plurality of test points. The plurality of characterization matrix test/response units are configured to apply a plurality of test signals to the first plurality of test points of the electrical power distribution system, and measuring a plurality of response signals at the second plurality of test points of the electrical distribution system. The system additionally includes at least one controller configured to coordinate the application of test signals, and configured to derive a characterization matrix for the electrical power distribution system based on the plurality of test signals and plurality of response signals. Further, the at least one controller is configured to characterize the electrical power distribution system based on the derived characterization matrix.

Other aspects and advantages of the described embodiments will become apparent from the following detailed description, taken in conjunction with the accompanying drawings, illustrating by way of example the principles of the described embodiments.

DETAILED DESCRIPTION OF INVENTION

The described embodiments provide non-invasive characterization of electrical power distribution systems. The described embodiments are operable, for example, for characterizing premises wiring of a building or structure wherein the wiring is inaccessible for visual inspection, and for which only limited blueprint information may be available.

The embodiments for characterizing and testing of electrical power distribution systems are simple and economical that they can be done as desired or deemed necessary. For example, if it is noticed by the inhabitants of the structure that there are circuits that are inoperable, excessively hot, sparking or arcing, or exposed, then such characterization and tests can be used to help determine the cause. As another example, during the buying or selling of a structure, or other exchange of ownership, the new owners or inhabitants might want such testing as a clause of the transaction.

There are known methods for testing individual electrical circuits. Such methods include testing probes that measure voltage at particular outlets or other test points to ensure that wiring to that outlet is intact and proper. Such methods are generally confined to measuring the response at the test point to which the test signal is applied. The embodiments described herein differ in many aspects including applying the test signal at one or more test points and measuring the response at a plurality of test points. Furthermore, the measurements at the plurality of test points can be processed analytically to deduce individual circuit characteristics that cannot be deduced by measuring at individual test points alone.

Figure 1:
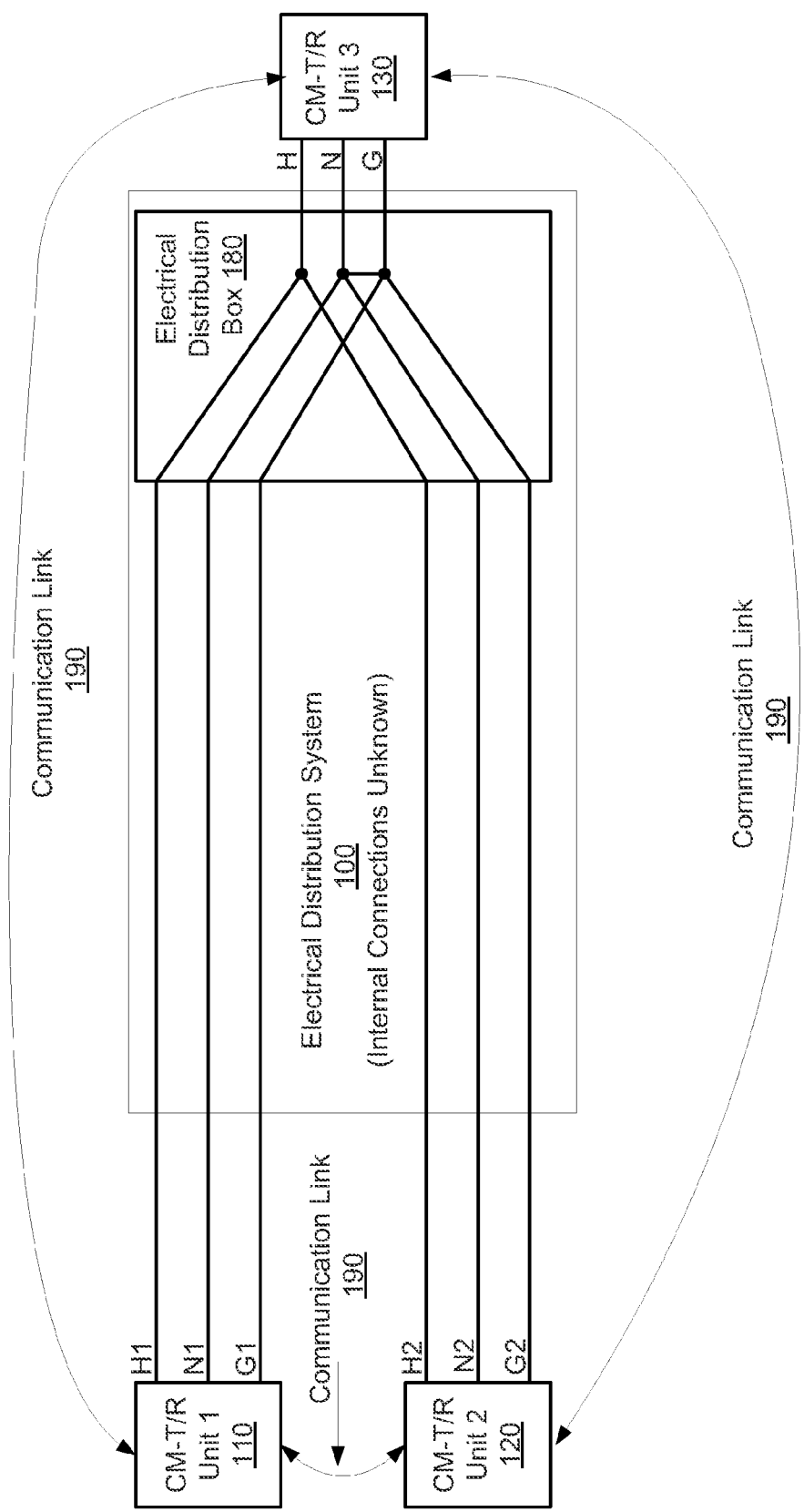
FIG. 1 shows an example of an electrical distribution system, and multiple characterization matrix test/response units for testing/characterizing the electrical distribution system.

FIG. 1 shows an example of an electrical distribution system 100, and multiple characterization matrix test/response (CM-T/R) units 110, 120, 130 for testing/characterizing the electrical distribution system 100, that includes an electrical distribution box 180. As shown, the CM-T/R units 110, 120, 130 are electrically connected to the electrical distribution system 100 at various points (to be referred to as "test points") or locations of the electrical distribution system 100. Generally, connections made at the test points are to "nodes". Additionally, communication links 190 are established between the multiple CM-T/R units 110, 120, 130 allowing the multiple CM-T/R units 110, 120, 130 to communicate information about test signals applied to the test points, and information about response signals measured at the test points. The communication link 190 may be implemented according to one or more of the various standard communication techniques such as wireless, wireline, or through the electrical power distribution system itself.

The communication links 190 between the multiple CM-T/R units 110, 120, 130 allow for coordinated application of test signals at one or more test points, and coordinated measurements of the responses at one or more test points. This coordination allows for more complete characterization of electrical distribution systems than available by single test point testing and characterization. For an embodiment, each of the test points includes at least one electrical contact or accessible wire around which may be placed a current-probe. A current-probe allows current measurements to be made without breaking the insulation of a wire.

A test point can include multiple electrical conductors and nodes. Further, test signals can be applied between pairs of electrical contacts at a test point. A test point generally means any location that is accessible to service personnel and connected to the electrical system of the structure. Such test points may include standard electrical outlets with receptacles normally used to connect appliances, or devices and switches used for control or lighting, or lighting outlets, or connection points at or within panel boxes. Such points are normally found mounted on or partially within a wall, ceiling or floor. These test points are particularly suited for introducing test signals or for making measurements that allow the condition of an electrical system to be ascertained.

For the purposes of description a "node" represents a wire or junction at which electrical properties can be measured or at which electrical currents can be injected. Typically, one or more nodes would be found at a test point, and a node would correspond to an electrical contact or conductor at a test point. A CM-T/R would generally be connected to one or more nodes at a test point.

For an embodiment, characterizing the electrical power distribution system based on the plurality of response signals includes deducing electrical properties of the individual branches of the electrical power distribution system. For another embodiment, characterizing the electrical power distribution system based on the plurality of response signals includes locating at least one fault within the system. Embodiments include observing response-signals for excessive resistance, excessive reactance at the operating frequency of the system, excessive power dissipation, or time-varying effects that indicate heating.

For the purposes of description here, the term "characterization" includes determining the electrical properties of the individual circuit conductors within branch circuits of the electrical power distribution system. Such properties include impedances and resistances of conductors and junctions. Characteristics of a conductor in good condition include low impedance at the operating line frequency of the electrical power distribution system. For example, 14AWG copper wire has a normal resistance at room temperature of 0.0025 ohms/foot. Any characterization of resistance more than this amount, might indicate a problem within the wire, or at a junction in which the wire is joined to other wires. Other forms of characterizations of an electrical distribution system include determining the number of branch circuits, the number of outlets on a given branch circuit, identifying which outlets are connected to which branch circuit, and the detection of branch circuits that have ground-fault or arc-fault protection. The number of outlets, and use of ground-fault protection is generally governed by local electrical codes.

One embodiment of a "blueprint" of the electrical distribution system includes associating the branch outlets and branch loads with the branch circuits. Such an embodiment allows the wiring diagram of the dwelling or structure to be constructed and evaluated.

The term "characterization" can also include identifying if the electrical power distribution system has any deficiencies that are shock-hazards, fire-hazards, code violations, or other defects that are not easily determined in systems that cannot be easily accessed or visually inspected.

One outcome of the characterization process would include a determination of whether the system can perform its intended function safely and in the manner it was designed. Another outcome would include a determination of whether there are any design deficiencies, or if the blueprint contains code violations.

For the purposes of discussion here, the term "condition" means the following: A system in "good" condition can supply the rated loads to the circuits being tested without presenting a fire danger or excessive resistance or reactance. Such a system can be considered safe to use in the method for which it is rated. A system in "fair" condition can supply the rated loads, but might have code violations or wiring deficiencies that need attention. Such a system might need repair, but can still be used without near-term hazard. A system in "poor" condition has one or more faults that are shock or fire hazards, or prohibit the rated load from being delivered to one or more outlets or test points. A system in "poor" condition would normally not be used until it is repaired. It should be de-energized.

An example of a branch circuit in poor condition would allow excessive power dissipation within the circuit without triggering the overcurrent device normally located at the service panel.

For the purposes of discussion here, the term "fault" includes any condition that presents a potential health, shock, or fire hazard or violation of generally accepted safe construction or wiring practices. A fault may include improper modifications to, or be the result of deterioration to, a property designed system. Other faults may be the result of changes to design, codes, and construction practices. Systems designed in a given year according to generally accepted safe practices may, even in the absence of significant deterioration, have faults of design, wiring, or construction that are identified in subsequent years as a result of changing practices or codes.

An example of a fault that is a potential fire hazard is the use of wiring that does not have the ampacity to supply the load rating for a fuse or circuit-breaker in its path. This is a fault of design or construction. Such a fault could be located by examining the entries of the characterization matrix described herein, and comparing these entries against one or more thresholds for the severity of the fault.

Another example of a fault includes sharing the main branch circuit for a bathroom in a business or residence as the supply for other rooms. Another example is omitting ground-fault protection in the main branch circuit for a kitchen or bathroom. These are examples of faults that may be the result of changes in generally accepted codes, since residences built prior to certain years were not required to have ground fault protection.

Another example of a fault includes a point of high resistance or impedance in a junction box because of deterioration of a junction contained in the box. Another example is a point or area of high resistance in an inaccessible location that is the result of action by vermin or weather. These two examples are faults due to deterioration of what was formerly a safe electrical system. Points of high resistance are widely recognized as fire hazards. For embodiments, characterizing the power distribution system includes determining if there is a fault at one location or more than one location.

Another example of a fault includes excessive heating, which may result from improper bundling or routing of wiring or cables or the use of wiring that cannot supply sufficient load. Such a fault would not necessarily be obvious by inspection since electrical codes can only supply guidelines for routing and cannot cover all circumstances.

As described, the test signals can be applied to at least one test point and a plurality of responses to the test signal observed. A test signal can be active or passive.

A passive test signal has the property that it is a resistive or reactive load. Generally, a passive test signal would be applied to circuits that are energized by some other means such as through its normal connection to the service panel. One example of a response signal that is measured during the application of a passive test signal could be any change in voltage of the already-energized circuit as the passive test signal is applied.

An active test signal has the property that it supplies its own source of power, for example, an injected current. An active test signal has the advantage that it may be used in circuits that are not energized. Such a test signal may be an alternating current (AC) generated to be near the intended operating frequency of the power distribution system. Common choices would be the 50 Hz or 60 Hz standards employed in many countries. Another common choice would be direct current (DC).

Figure 2A:
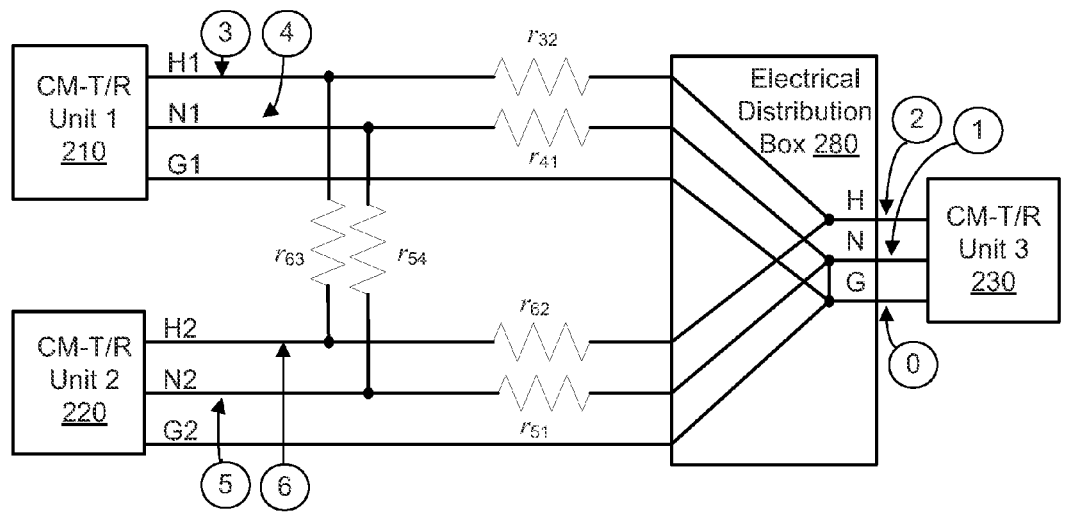
FIG. 2A shows an example of an electrical distribution system with a distribution box and two test points where characterization matrix test/response units may be connected.
Figure 2B:
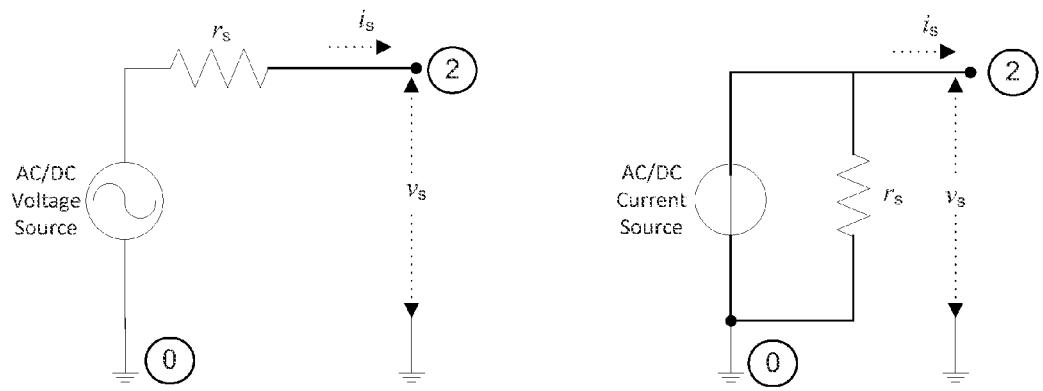
FIG. 2B shows a voltage source or, alternatively, a current source connected between node 0 (the reference node) and node 2.

FIG. 2B shows a voltage source connected between node 0 (the reference node) and node 2. It has an internal resistance represented by $r_s$. Also shown is a current source having equivalent shunt resistance of $r_s$. In general it is desirable for a voltage source to have a low internal resistance, and for a current source to have a high shunt resistance. For purposes of discussion, it is assumed that $r_s$ is known and properly accounted for. For purposes of characterizing the electrical power distribution system, frequencies other than 50 Hz or 60 Hz may be of use as well.

It may be advantageous to distribute an electrical connection between one or more test points and a reference node of the network which would then function as a common test point. As in FIG. 2B, either a test voltage source or a test current source is then connected between a node and the common test point, and response voltages or currents may be measured with respect to the common test point. The common test point may be distributed to other test points through one or more wired connections, or through a common ground.

The application of a test signal can include application of passive resistive or reactive load or active injection of voltage or current signal. By applying a test signal in the form of a known calibrated load to an outlet of known voltage, the electrical current can be measured to determine if the branch circuit conductors connected to the outlet are able to supply the necessary power to the circuit. The injection of a voltage or current test signal is sometimes used to look for breakages in electrical networks, where the reflection of the signal from this breakage is used to determine the approximate location and severity of the break.

A "response-signal" at a test point may constitute any of voltage, current, temperature, resistance, conductance, impedance, inductance, or capacitance, or similar physical attribute associated with an electrical system or network. The instrument measuring the response signal should not influence the circuit appreciably by drawing significant current or being a significant load. It is to be understood that a response signal may be measured with or without application of a test signal generated by a CM-T/R unit. It is often the case that the difference in the response signal before application and during application of a test signal by a CM-T/R unit is of significance, especially on a power distribution system that is live (is powered by external means). An example of a response signal that can be made without a test signal generated by a CM-T/R unit includes voltage measurements between contacts at a test point in a live circuit. In this case, the line voltage already supplied in the live circuit acts as a test signal not supplied by a CM-T/R unit. Similarly, a plurality of CM-T/R, units may make measurements of voltages at a plurality of test points with no test signal generated by a CM-T/R unit. Such measurements of response signals without having the CM-T/R unit generate test signals establish a "baseline" which is used in the characterization of the electrical circuit.

After the baseline is established, a CM-T/R unit may supply a resistive load at a test point as an example of a CM-T/R unit generated test signal. During the application of this load, a plurality of CM-T/R units may make measurements of the response signals. The differences in response signals (in this example, voltage differences between baseline and application of the resistive load) may be used to characterize the electrical power distribution system.

If the power distribution system is not live at the time of testing, a CM-T/R unit may apply a test signal that supplies voltage to the circuit so that all CM-T/R units may establish a baseline. Such a test signal used for establishing a baseline is called a "baseline signal." If the circuit is live at the time of testing, the signal already present may be called the "baseline signal". The response measured by a CM-T/R unit to a baseline signal is called a "baseline measurement." Hence, a baseline measurement may be made with or without a CM-T/R unit supplying the baseline signal.

Between any two points of an electrical system (say test points "1" and "2"), there are various physical properties or characterizations that may be measured between these two points. Examples include resistance, admittance, capacitance, inductance, potential, and impedance. Such physical properties and characterizations are important to the performance of an electrical distribution system. For example, low resistance and inductance are important when alternating current needs to flow between points 1 and 2. High resistance is important when no current is desired.

Other examples of characterizations that may be measured include those sometimes found in a distribution system where dissimilar metals, such as copper and aluminum, are used in close contact. Such effects include galvanic and rectification (diode).

Characterizations such as resistance are independent of direction in that they do not depend on how the points are labeled; the resistance between points 1 and 2 is the same as between points 2 and 1. Diode effects are, however, direction-dependent.

Resistance can be measured by relating the voltage at a point to the injected current at that point, relative to a reference point. Hence, resistance can be thought of as a characterization of that point, relative to a reference. This is an example of a scalar characterization. A characterization matrix relates a physical quantity (such as currents) at a plurality of nodes to another physical quantity such as voltages at these nodes.

Examples of characterization matrices include admittance and impedance matrices, which are now described.

Admittance and Impedance Matrices

FIG. 2A shows an example of an electrical distribution system with a distribution box 280 and two test points where characterization matrix test/response units 210, 220, 230 may be connected. Also shown are circled node labels 0, . . . , 6, and impedances between these nodes, which are generally unknown. Node 0 serves as a "reference node". More generally, consider a resistive network comprising N+1 nodes denoted 0, 1, . . . , N, where each node is connected to every other node by a resistor ($r_{32}, r_{41}, r_{63}, r_{54}, r_{62}, r_{51}$), or more generally an impedance. Consider assigning a potential of zero to node 0 which functions as a reference node. All voltages measurements are made with respect to the reference node, and a current source or a voltage source is connected between the reference node and any of nodes 1, . . . , N.

The network is described by a N×N admittance matrix, Y, or equivalently by an impedance matrix, $Z = Y^{-1}$. Let $\overline{V} = [v_1 v_2 \ldots v_N]^T$ denote the N×1 vector of voltages on nodes 1, 2, . . . , N, and let $\overline{I} = [i_1 i_2 \ldots i_N]^T$ denote N×1 vector of currents which are injected into nodes 1, 2, . . . , N from the exterior of the network. By definition, $\overline{I} = Y\overline{V}$, or $\overline{V} = Z\overline{I}$. Let the impedance of the branch which connects node j with node k be denoted by $r_{jk} = r_{kj}$. According to Kirchoff current law (KCL), the current inch is injected into anode from the exterior must be equal to the sum of the currents which flow from that node to the other nodes; in turn, the currents which flow to the other nodes can be obtained from the associated voltage drops according to Ohm's law, $$i_j = \sum_{k=0, \neq j}^{N} \frac{v_j - v_k}{r_{jk}}, \quad v_0 = 0. \tag{1}$$

From this relation the admittance matrix can be directly obtained in terms of the branch resistances, $$y_{jk} = \begin{cases} \sum_{\ell=0, \neq j}^{N} \frac{1}{r_{j\ell}}, & k = j \\ -\frac{1}{r_{jk}}, & k \neq j. \end{cases} \tag{2}$$

For example, with two nodes, the admittance matrix is $$Y = \begin{bmatrix} \frac{1}{r_{10}} + \frac{1}{r_{12}} & -\frac{1}{r_{12}} \\ -\frac{1}{r_{12}} & \frac{1}{r_{12}} + \frac{1}{r_{20}} \end{bmatrix},$$

and the associated impedance matrix is $$Z = Y^{-1} = \left( \frac{1}{\frac{1}{r_{10}r_{12}} + \frac{1}{r_{10}r_{20}} + \frac{1}{r_{12}r_{20}}} \right) \cdot \begin{bmatrix} \frac{1}{r_{12}} + \frac{1}{r_{20}} & \frac{1}{r_{12}} \\ \frac{1}{r_{12}} & \frac{1}{r_{10}} + \frac{1}{r_{12}} \end{bmatrix}.$$

Total power dissipated in the network must be nonnegative, and this fact may be represented as $$P = \overline{V}^T \overline{I} = \overline{I}^T Z \overline{I} = \overline{V}^T Y \overline{V} \geq 0, \tag{3}$$

so both the admittance matrix and the impedance matrix are symmetric, nonnegative-definite.

The symmetry of the admittance matrix is equivalent to reciprocity: if the injection of a current into node j results in a particular voltage on node k, the injection of the same current into node k will result in the same voltage on node j. The admittance matrix, times the vector of ones, is equal to a vector whose elements are the reciprocals of the resistances between each node and the reference node, $$Y\overline{1} = \begin{bmatrix} \frac{1}{r_{10}} & \frac{1}{r_{20}} & \ldots & \frac{1}{r_{N0}} \end{bmatrix}^T. \tag{4}$$

Physically this happens because, if the same voltage is applied to all nodes the only current that flows through the network is to the reference node.

It follows that all of the branch resistances can be inferred simply from knowledge of the admittance matrix. The off-diagonal elements, $-1/r_{jk}$, yield the branch resistances between all of the non-reference nodes. The relation (4) then yields the branch resistances to the reference node. Any symmetric matrix having the structure (2) is a valid admittance matrix.

Hence the admittance matrix Y is an example of a characterization matrix in that the electrical properties of the power distribution system may be inferred from it.

Similarly, an impedance matrix $Z = Y^{-1}$, which is the inverse of an admittance matrix may also be viewed as a characterization matrix. All of the elements of the impedance matrix are nonnegative. To verify this property, suppose that a positive current is injected into node j, and that at least one of the impedance entries in the j-th column is negative. Then the node associated with the smallest (e.g. most negative) entry in that column has a negative voltage which is smaller than any other voltage in the network. This implies that currents from all other nodes flow to that node, a condition which would violate KCL.

The admittance matrix is typically easier to make inferences from than the impedance matrix (see earlier example for M=2). One can derive the branch resistances from the admittance matrix by inspection. In general, the terms in the impedance matrix comprise M-fold products of branch resistances.

Complex Branch Impedances

The previous description of admittance and impedance matrices carries over to the case where the branch resistances are modeled as a combination of resistors, capacitors, and inductors whose impedances are complex-valued functions of frequency. As before both the admittance matrix and the impedance matrix are symmetric. The real parts of the admittance matrix and the impedance matrix are nonnegative-definite.

Characterization of the Distribution System from the Admittance and Impedance Matrices The measurement of the admittance matrix or the impedance matrix enables one to compute a number of electrical properties of the distribution system, and therefore to detect faults or dangerous conditions.

One can directly infer the branch impedances from the entries of the admittance matrix. For two nodes that are nominally insulated from each other the branch resistance connecting the nodes should be very large. A branch that is supposed to carry power from one node to another should have a comparatively small resistance. The inferred branch resistance could be combined with an estimate of the length of the branch wire (derived from knowledge of the physical location of the nodes and possible routing of the branch wire, or from a direct measurement of length obtained by injecting an appropriate timing pulse into one of the nodes) to yield an estimate for the resistance per unit length of the branch wire, and therefore its gauge.

If the distribution system is connected to an external source of power one can compute, for any combination of loads applied to the outlets of the system, node-voltages and branch-currents by solving a set of simultaneous linear equations. Contained in this solution are the service-voltages delivered to each load (generally less than the magnitude of the voltage of the source of power). The power that is dissipated in each branch-resistance may be computed by multiplying the branch-current by the magnitude of the voltage-difference between the two nodes. Excessive power dissipation in any branch implies a hazardous condition for the combination of loads.

Hidden Nodes

In practice it may be possible to access only a subset of the nodes. This could happen either because insufficient CM-T/R units are available, or because one or more nodes are, for example, hidden behind a wall and are not directly accessible. Assume that nodes $1, 2, \ldots, M$ (accessible) nodes (including the reference node) are available for testing, and that the remaining (hidden) nodes $M+1, \ldots, N$ are not available for testing. One can inject currents into active nodes and measure voltages on active nodes, but neither action can be performed on hidden nodes. The admittance and impedance matrices partition naturally as follows, $$Y = \begin{bmatrix} Y_{11} & Y_{12} \\ Y_{21} & Y_{22} \end{bmatrix}, Z = \begin{bmatrix} Z_{11} & Z_{12} \\ Z_{21} & Z_{22} \end{bmatrix}. \quad (5)$$

Because $\bar{I}_2 = \bar{0}$ we $$\bar{I}_1 = Y_{11}\bar{V}_1 + Y_{12}\bar{V}_2$$

$$\bar{0} = Y_{21}\bar{V}_1 + Y_{22}\bar{V}_2. \quad (6)$$

The solution of the second of (6) for $\bar{V}_2$ and the substitution into the first equation of (6) yields the active and the hidden voltages in terms of the active currents, $$\bar{V}_2 = -Y_{22}^{-1} Y_{21} \bar{V}_1$$

$$\bar{V}_1 = (Y_{11} - Y_{12} Y_{22}^{-1} Y_{21})^{-1} \bar{I}_1 = Z_{11} \bar{I}_1. \quad (7)$$

Thus the injection of currents into active nodes, and the measurement of the resulting voltages on the active nodes yields the active portion of the impedance matrix, $Z_{11}$, which, in turn, is related in a complicated manner to the entire admittance matrix.

The measurements at the active nodes yields an "apparent" M×M admittance matrix $$Y_{apparent} = (Z_{11})^{-1} = (Y_{11} - Y_{12} Y_{22}^{-1} Y_{21}) \quad (8)$$

This is a valid admittance matrix in that the off-diagonal elements are non-positive valued, and that, as in (4), multiplication of the vector of one's by the matrix results in a nonnegative-valued vector. To show that the off-diagonal elements are non-positive, it can be first noted that both $Y_{11}$ and $Y_{22}$ are themselves valid admittance matrices, so the off-diagonal elements of $Y_{11}$ are non-positive, and the inverse of $Y_{22}$ is a valid impedance matrix and it therefore has non-negative entries. The elements of $Y_{12}$ are non-positive. Hence, the off-diagonal elements of $Y_{apparent}$ are non-positive. This apparent admittance, times a vector of ones, yields a non-negative vector. To show this, consider that this multiplication is equivalent to applying equal positive voltages to the active nodes. Suppose that one of the resulting currents was negative; this could only happen as a result of a flow of current from one or more of the hidden nodes towards that node. In turn, these hidden nodes would have a voltage higher than the applied voltage. One of the hidden nodes would have a voltage greater than any other node in the network. All current would flow away from that node, which would violate KCL.

Hence what is measured at a set of accessible nodes results is an apparent admittance matrix which is itself a valid admittance matrix even though some nodes may be hidden.

By way of illustration, consider the M=2 case studied previously, and suppose that nodes 0 and 1 are accessible while node 2 is hidden. In that case the apparent admittance is a scalar which describes the branch between nodes 0 and 1, $$Y_{apparent} = (Z_{11})^{-1}$$

$$= \frac{\frac{1}{r_{10}r_{12}} + \frac{1}{r_{10}r_{20}} + \frac{1}{r_{12}r_{20}}}{\frac{1}{r_{12}} + \frac{1}{r_{20}}}$$

$$= \frac{1}{r_{10}} + \frac{1}{r_{20} + r_{12}}.$$

Note that the apparent resistance of the branch that connects nodes 0 and 1 is less than or equal to the resistance of the physical branch that directly connects nodes 0 and 1 because of the parallel shunt through the hidden node 2. Since hidden nodes can only lower resistance, any resistance that was calculated to be excessive would therefore still indicate a potentially hazardous condition.

It can be shown for the most general case that a branch resistance that is inferred from the apparent admittance matrix (8) is always less than or equal to the resistance of the physical branch that directly connects the respective accessible nodes. This is because any hidden nodes could shunt additional current between the nodes.

White hidden nodes can complicate the characterization of a distribution system, it is still possible to account for possible hidden nodes in a "safe" manner. In particular suppose that the apparent admittance matrix is obtained for a set of accessible nodes, that an external source of power is applied as a voltage source through the accessible nodes, and that a set of loads are connected to some of the accessible nodes. It can be shown that there is sufficient information to compute, by solving a system of linear equations, the resulting voltages on the accessible nodes and the apparent currents that connect all pairs of accessible nodes. Hence the service voltage delivered to each load can be calculated. The magnitude of the product of the voltage between any pair of accessible nodes and the apparent current between the nodes is equal to an apparent power dissipated in the associated branch, which is greater than or equal to the actual power that is dissipated in the physical branch. If the apparent power that is dissipated in the branch is deemed safe, then irrespective of the existence of hidden nodes, the actual power dissipated in the branch will be smaller, and therefore will be safe.

Characterization-Matrix Test/Response Unit

Figure 3:
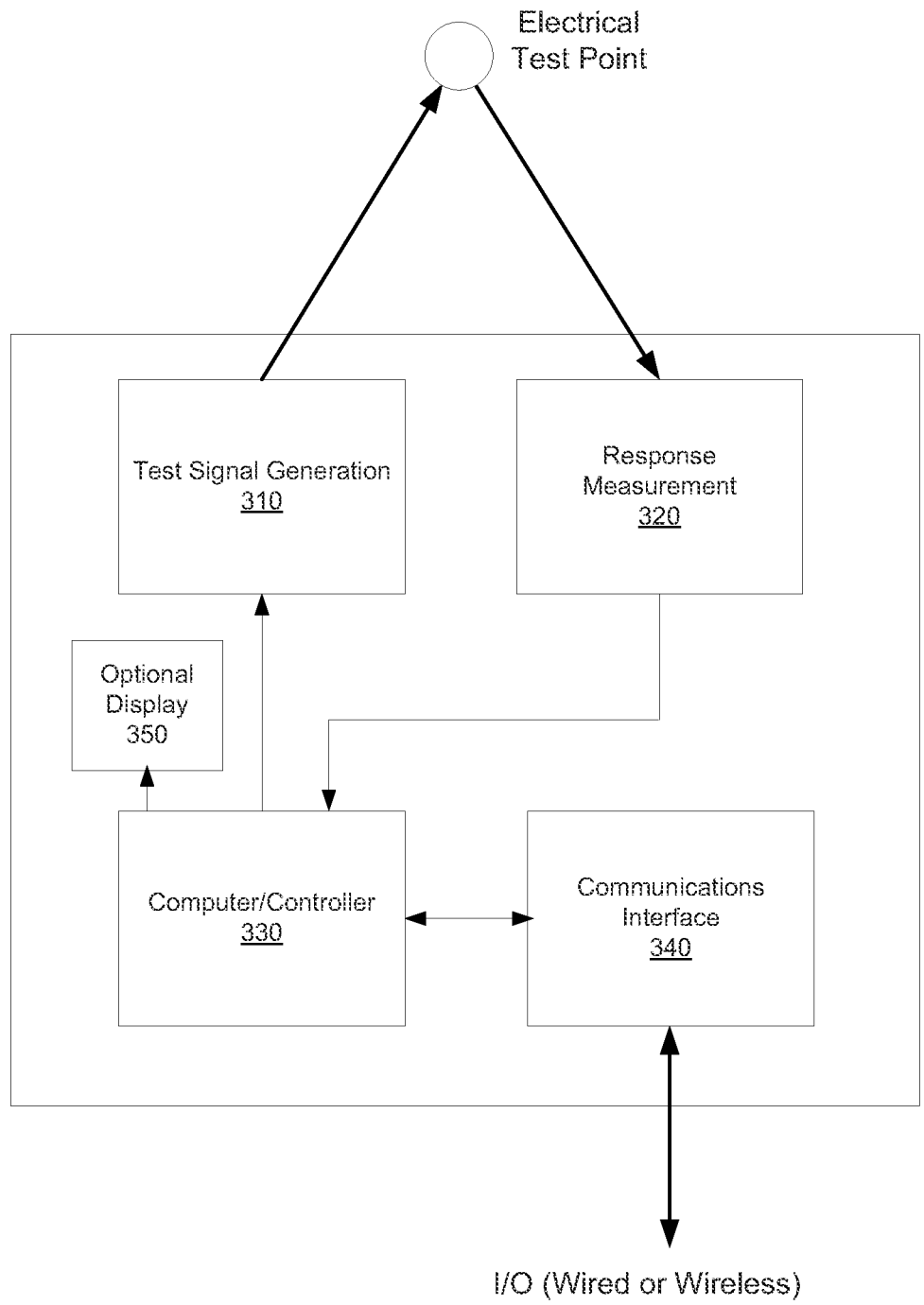
FIG. 3 is a block diagram of a characterization matrix test/response (CM-T/R) unit according to an embodiment.

FIG. 3 is a block diagram of a CM-T/R unit according to an embodiment. The CM-T/R unit is connected to an electrical test point through one or more nodes, and may generate an active or passive test signal 310, and measure a response 320 under the control of a computer/controller 330. The signal is transmitted through a communications interface 340, which may be wireline or wireless, to either other CM-T/R units or a central controller. Part or whole of the computation of the characterization matrix may be done within the computer/controller 330. An optional display 350 may display results for human interpretation.

During the operation of the CM-T/R unit there may be loads present, such as transformers or motors, which present low impedance at DC, and relatively high impedance at the line-frequency. A DC measurement therefore might lead to anomalous interpretations. For this reason is may be expedient to perform the testing at or near the line frequency rather than at DC.

Characterization-Matrix Test/Response System

Figure 4:
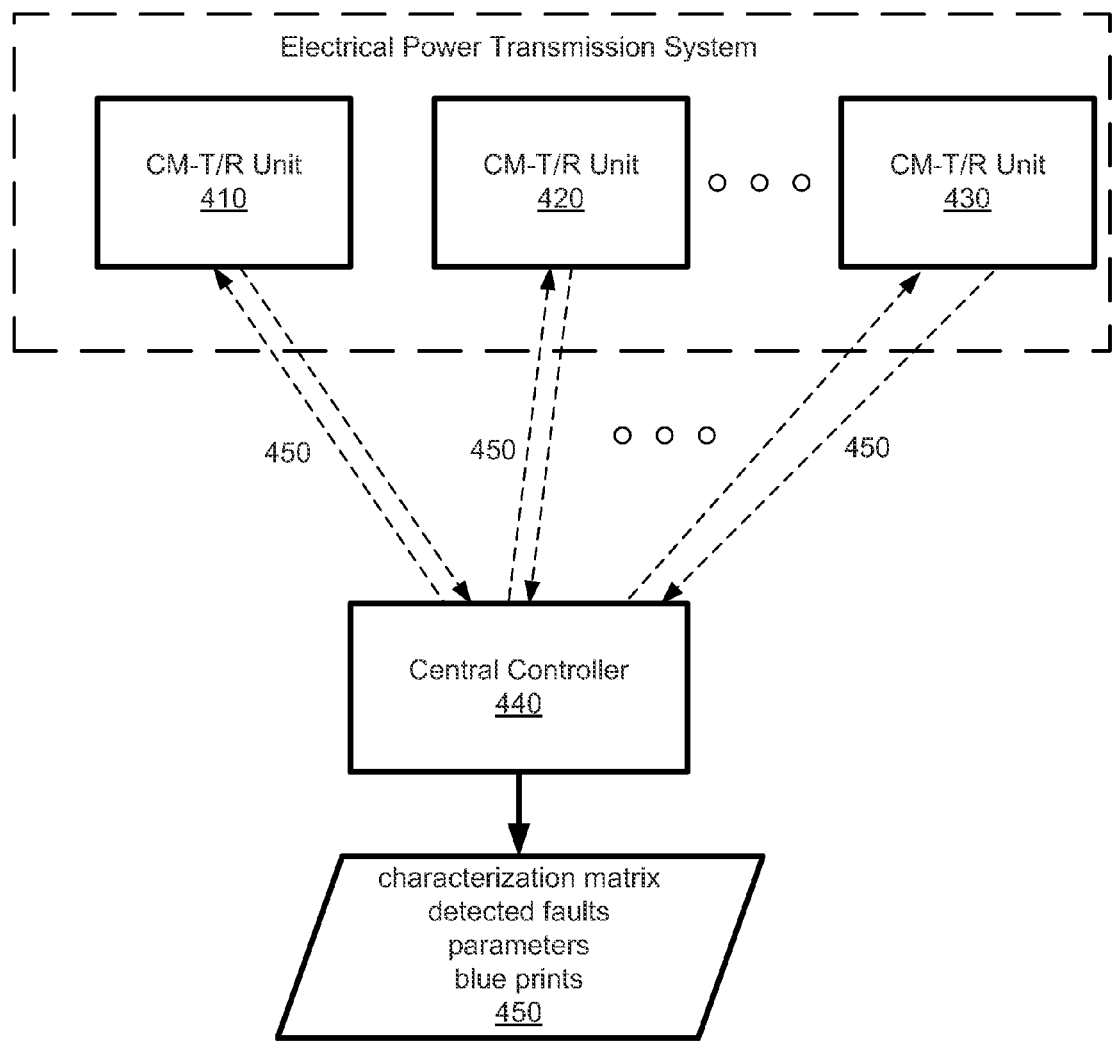
FIG. 4 shows a characterization-matrix test/response system that includes a plurality of CM-T/R units under the control of a central controller, according to an embodiment.

FIG. 4 shows a characterization-matrix test/response system that includes a plurality of CM-T/R units (410, 420, 430) under the control of a central controller (440), according to an embodiment. In this embodiment, the CM-T/R units (410, 420, 430) may be instructed by the central controller 440 to issue test signals and measure response signals according to a schedule from which the controller (440) may compute the characterization matrix. The characterization matrix is subsequently analyzed for detected faults in the electrical power distribution system and possible blueprints (450). Optionally, the controller can be contained within one or more of the CM-T/R units.

One way to operate the system is for each CM-T/R unit, in turn, to inject a current into its node, while the same CM-T/R unit and all of the other CM-T/R units measure the resulting voltage-response on their respective nodes. This possibly time-consuming procedure can be shortened if the CM-T/R units inject simultaneous currents which are mutually orthogonal in time. Each CM-T/R unit measures the combined voltage-response, and the correlation of this combined response with each of the orthogonal signals gives the individual responses. Examples of orthogonal signals include harmonically-related sine-waves for which the correlation operations can be performed efficiently via the fast Fourier transform, or Walsh functions (orthogonal square-waves) for which there is also an algorithm for fast correlation.

Figure 5:
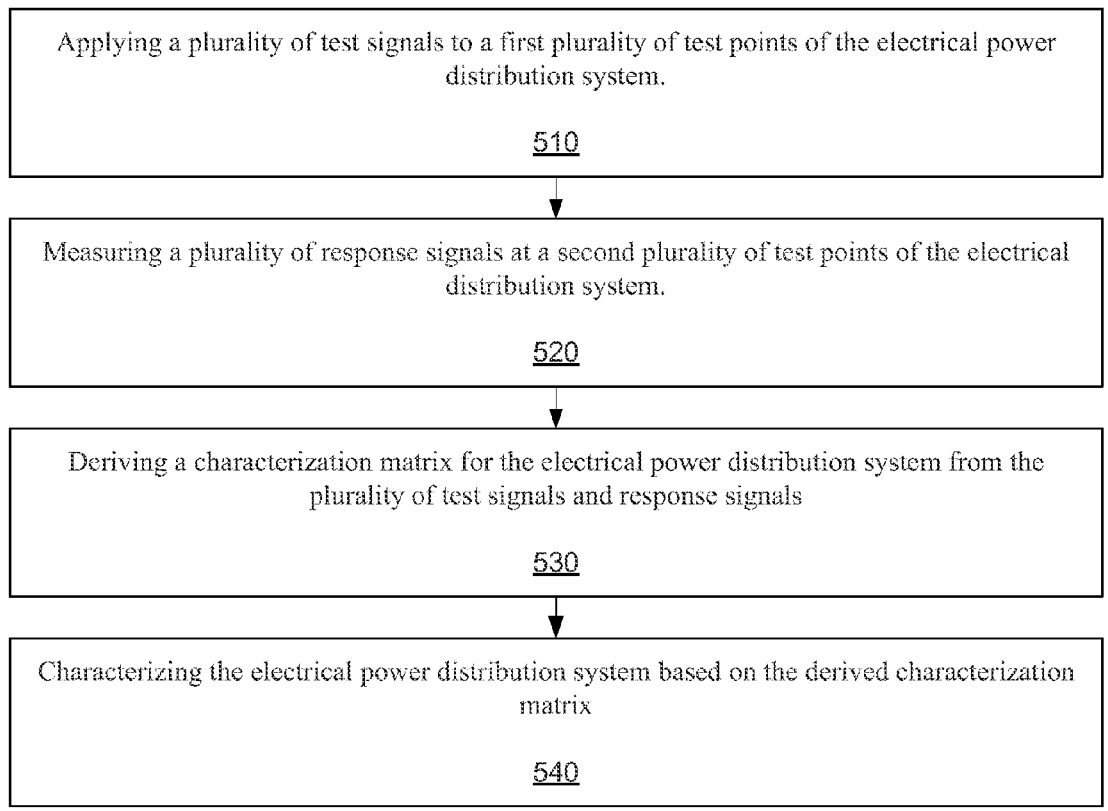
FIG. 5 is a flow chart that includes steps of a method of characterizing an electrical power distribution system, according to an embodiment.

FIG. 5 is a flow chart that includes steps of a method of characterizing an electrical power distribution system, according to an embodiment. A first step 510 includes applying a plurality of test signals to a first plurality of test points of the electrical power distribution system. A second step 520 includes measuring a plurality of response signals at a second plurality of test points of the electrical distribution system. A third step 530 includes deriving a characterization matrix for the electrical power distribution system from the plurality of test signals and response signals. A fourth step 540 includes characterizing the electrical power distribution system based on the derived characterization matrix. For an embodiment, one or more of the first plurality of test points are the same as the second plurality of test points. The test signals can include voltage and/or currents, and the response signals can include voltages and/or currents. For one embodiment, the characterization matrix includes an admittance matrix. For another embodiment, the characterization matrix includes an impedance matrix.

An embodiment further includes establishing a baseline measurement at at-least one of the first plurality of test points, before applying the plurality of test signals. For a specific embodiment, establishing the baseline measurement includes measuring a signal response at at-least one of the second plurality of test points without applying test signals, For another specific embodiment, establishing the baseline measurement includes applying a baseline test signal at at-least one of the first plurality of test points.

For an embodiment, characterizing the electrical power distribution system includes deriving branch impedances associated with branches of the electrical power distribution system from the admittance matrix. For an embodiment, a blue print of the electrical power distribution system is derived based on the branch impedances.

For an embodiment, characterizing the electrical power distribution system based on the characterization matrix includes locating at least one fault in the electrical power distribution system.

For an embodiment, characterizing the electrical power distribution system based on the characterization matrix includes computing dissipated power. For a specific embodiment, the computed dissipated power is compared against thresholds to determine the presence of faults.

For an embodiment, the test signals and response signals are referenced with respect to a common test point. For a specific embodiment, the common test point is distributed to at least one of the first plurality of test points and the second plurality of test points through one or more wired connections. For an embodiment, the common test point is distributed to at least one of the first plurality of test points and the second plurality of test points through a common ground.

For an embodiment, the plurality of test signals and response signals are multiplexed through temporally orthogonal signaling.

Although specific embodiments have been described and illustrated, the embodiments are not to be limited to the specific forms or arrangements of parts so described and illustrated. The embodiments are limited only by the appended claims.

What is claimed:

1. A method of characterizing an electrical power distribution system, comprising:
applying, by a plurality of test/response units, a plurality of test signals to a first plurality of test points of the electrical power distribution system, wherein the first plurality of test points are electrically connected to the electrical power distribution system and the plurality of test/response units are electrically connected to the first plurality of test points;
measuring, by a plurality of test/response units, a plurality of response signals at a second plurality of test points of the electrical distribution system, wherein the second plurality of test points are electrically connected to the electrical power distribution system and the plurality of test/response units are electrically connected to the second plurality of test points;

communicating, by the plurality of test/response units, the plurality of response signals to at least one controller;

deriving, by the at least one controller, a characterization matrix for the electrical power distribution system from the plurality of test signals and the plurality of response signals;

characterizing, by the at least one controller, the electrical power distribution system based on the derived characterization matrix.

2. The method of claim 1, wherein one or more of the first plurality of test points are the same as the second plurality of test points.

3. The method of claim 1, further comprising establishing a baseline measurement at at-least one of the first plurality of test points, before applying the plurality of test signals.

4. The method of claim 3, wherein establishing the baseline measurement comprises measuring a signal response at at-least one of the second plurality of test points without applying test signals.

5. The method of claim 3, wherein establishing the baseline measurement comprises applying a baseline test signal at at-least one of the first plurality of test points.

6. The method of claim 1, wherein the test signals comprise voltages and the response signals comprise currents.

7. The method of claim 1, wherein the test signals comprise currents and the response signals comprise voltages.

8. The method of claim 1, wherein the characterization matrix comprises an impedance matrix.

9. The method of claim 1, wherein the characterization matrix comprises an admittance matrix.

10. The method of claim 9, wherein characterizing the electrical power distribution system comprising deriving branch impedances associated with branches of the electrical power distribution system from the admittance matrix.

11. The method of claim 10, further comprising deriving a blue print of the electrical power distribution system based on the branch impedances.

12. The method of claim 1, wherein characterizing the electrical power distribution system based on the characterization matrix comprises locating at least one fault in the electrical power distribution system.

13. The method of claim 1, wherein characterizing the electrical power distribution system based on the characterization matrix includes computing a dissipated power.

14. The method of claim 13, wherein the dissipated power is compared against thresholds to determine the presence of faults.

15. The method of claim 1, wherein the test signals and response signals are referenced with respect to a common test point.

16. The method of claim 15, wherein the common test point is distributed to at least one of the first plurality of test points and the second plurality of test points through one or more wired connections.

17. The method of claim 15, wherein the common test point is distributed to at least one of the first plurality of test points and the second plurality of test points through a common ground.

18. The method of claim 1, wherein the plurality of test signals and response signals are multiplexed through temporally orthogonal signaling.

19. A system for characterizing an electrical power distribution system, comprising:

a plurality of characterization matrix test/response units electrically attached to a first plurality of test points and a second plurality of test points, wherein the first plurality of plurality of test points and the second plurality of test points are electrically connected to the system, the plurality of characterization matrix test/response units configured to apply a plurality of test signals to the first plurality of test points of the electrical power distribution system, and measure a plurality of response signals at the second plurality of test points of the electrical distribution system;

communication links between the plurality of characterization matrix test/response units and at least one controller, allowing the plurality of characterization matrix test/response units to communicate with the at least one controller;

the at least one controller coordinating application of the plurality of test signals, and configured to derive a characterization matrix for the electrical power distribution system based on the plurality of test signals and the plurality of response signals, and to characterize the electrical power distribution system based on the derived characterization matrix.

20. The system of claim 19, wherein the at least one controller is contained within at least one of the plurality of characterization matrix test/response units.

21. A characterization matrix test/response unit that is connectable to an electrical power distribution system, the unit operative to:

apply at least one test signal to at least one test point of the electrical power distribution system, wherein the at least one test point is electrically connected to the electrical power distribution system and the test/response unit is electrically connected to the at least one test point;

measure at least one response signal at the at least one test point, wherein the at least one response signal is generated in response to the at least one test signal;

communicate with other characterization matrix test/response units or a central controller from which it receives instructions; and transmit the results of its measured response signal to the central controller, enabling the central controller to derive a characterization matrix for the electrical power distribution system based on a plurality of test signals and a plurality of response signals, and to characterize the electrical power distribution system based on the derived characterization matrix.

22. The characterization matrix test/response unit of claim 21, wherein the characterization matrix test/response unit further comprises the central controller.

23. A characterization matrix central control unit, the unit operative to:

communicate with characterization matrix test/response units, the characterization matrix test/response units capable of applying a plurality of test signals to a first plurality of test points of the electrical power distribution system, and measure a plurality of response signals at a second plurality of test points of the electrical distribution system, wherein the first plurality of test points and the second plurality of test points are electrically connected to the electrical power distribution system;

send command and control messages and receive response and measurement information from the characterization matrix test/response units;

derive a characterization matrix for the electrical power distribution system from the plurality of test signals and response signals; and characterize the electrical power distribution system based on the derived characterization matrix.

* * * * *